(12) United States Patent
Zhu et al.

(10) Patent No.: US 8,344,931 B2
(45) Date of Patent: Jan. 1, 2013

(54) N-BITS SUCCESSIVE APPROXIMATION REGISTER ANALOG-TO-DIGITAL CONVERTING CIRCUIT

(75) Inventors: Yan Zhu, Macau (CN); Chi-Hang Chan, Macau (CN); U-Fat Chio, Macau (CN); Sai-Weng Sin, Macau (CN); Seng-Pan U, Macau (CN); Rui Paulo Da Silva Martins, Macau (CN); Franco Maloberti, Torre d'Isola (IT)

(73) Assignee: University of Macau, Macau (CN)

( * ) Notice: Subject to any disclaimer, the term of this patent is extended or adjusted under 35 U.S.C. 154(b) by 85 days.

(21) Appl. No.: 13/150,508

(22) Filed: Jun. 1, 2011

(65) Prior Publication Data

US 2012/0306679 A1 Dec. 6, 2012

(51) Int. Cl.
*H03M 1/12* (2006.01)
(52) U.S. Cl. .......................... 341/172; 341/155; 341/163
(58) Field of Classification Search .................. 341/155, 341/163, 172
See application file for complete search history.

(56) References Cited

U.S. PATENT DOCUMENTS 5,581,252 A * 12/1996 Thomas ........................ 341/144
6,400,302 B1 * 6/2002 Amazeen et al. ............. 341/172
6,587,066 B1 * 7/2003 Somayajula ................... 341/172
8,004,447 B2 * 8/2011 Hsu ............................... 341/161
8,040,271 B2 * 10/2011 Furuta et al. ................... 341/172

OTHER PUBLICATIONS

Yan Zhu, Chi-Hang Chan, U-Fat Chio, Sai-Weng Sin, Seng-Pan U, Rui Paulo Da Silva Martins, Franco Maloberti, "A 10-bit 100-MS/s Reference-Free SAR ADC in 90nm CMOS," IEEE Journal of Solid-State Circuits, Jun. 2010, pp. 1111-1121, vol. 45, No. 6, U.S.A.

* cited by examiner

*Primary Examiner* — Khai M Nguyen
(74) *Attorney, Agent, or Firm* — Bacon & Thomas, PLLC

(57) ABSTRACT

The present invention provides an n-bits successive approximation register (SAR) analog-to-digital converting (ADC) circuit, comprising: an n-bits SAR control logic, a p-type capacitor network including a $DAC_p$ array and a sampling capacitor $C_{Sp}$, an n-type capacitor network including a $DAC_n$ array and a sampling capacitor $C_{Sn}$; and a comparator for comparing outputs from the p-type capacitor network and the n-type capacitor network, wherein a power supply and ground are directly connected to the p-type capacitor network and the n-type capacitor network without using reference voltages produced by a reference voltage generator. The n-bits SAR control logic comprises n shift registers, n bit registers, and a switching logic. The comparator comprises a first pre-amplifier, a second pre-amplifier and a dynamic latch. Alternative, the comparator comprises a four-input pre-amplifier and a dynamic latch.

6 Claims, 4 Drawing Sheets

N-BITS SUCCESSIVE APPROXIMATION REGISTER ANALOG-TO-DIGITAL CONVERTING CIRCUIT

FIELD OF THE INVENTION

The present invention relates to an n-bits successive approximation register (SAR) analog-to-digital converting (ADC) circuit, and more particular to a SAR ADC circuit without using the reference voltages produced by a reference voltage generator.

DESCRIPTION OF RELATED ART

Low power is the most relevant design concern for battery-powered mobile applications. Conventionally, a pipeline ADC is commonly used because of its power efficiency. The pipeline architecture does not benefit from the technology scaling because the use of low voltage supplies gives rise to an augmented consumption of power. Recently, a SAR architecture has re-emerged as a valuable alternative to the pipeline solution.

The speed of a SAR ADC circuit is determined by the time required by a digit-to-analog (DAC) circuit to settle within ½-LSB (least significant bit). With large number of bits and capacitive arrays, the main cause of power consumption is the reference voltage generator that must provide very low output resistance. The total power dissipation in a SAR ADC is dominated by the reference voltage generator, while the power consumed by the comparator and the switching is a small fraction of the total power.

SUMMARY OF THE INVENTION

The object of the present invention is to provide an n-bits SAR ADC circuit without using the reference voltages produced by a reference voltage generator so as to further improve power efficiency.

According to one aspect of the present invention, there is provided an n-bits SAR ADC circuit, comprising: an n-bits SAR control logic, a p-type capacitor network including a $DAC_p$ array and a sampling capacitor $C_{Sp}$, an n-type capacitor network including a $DAC_n$ array and a sampling capacitor $C_{Sn}$; and a comparator for comparing outputs from the p-type capacitor network and the n-type capacitor network, wherein a power supply and ground are directly connected to the p-type capacitor network and the n-type capacitor network without using reference voltages produced by a reference voltage generator.

According to the other aspect of the present invention, the n-bits SAR control logic comprises: n shift registers, n bit registers, and a switching logic.

According to another aspect of the present invention, the comparator comprises: a first pre-amplifier, a second pre-amplifier and a dynamic latch.

According to another aspect of the present invention, the comparator comprises a four-input pre-amplifier and a dynamic latch. Note that the two pre-amplifiers are implemented by using a four-input pre-amplifier.

The advantage of the present invention permits a reference voltage free operation. The benefit of the reference voltage free operation is to remove the static power dissipation from the reference generator, and the successive approximation conversion can also be speeded up due to low impedance of the supply network.

BRIEF DESCRIPTION OF THE DRAWINGS

FIG. 2a shows a conceptual sampling scheme and the connecting relationship of the capacitor network and the pre-amplifier shown in FIG. 1.

FIG. 2b shows the successive approximation (SA) conversion scheme, where the output of DAC array converges to the negative sampled signal on $C_S$ at the ref-terminal of the per-amplifier shown in FIG. 2a.

DETAILED DESCRIPTION OF THE EMBODIMENT

A preferred embodiment of the present invention will be described hereinafter with reference to the accompanying drawings.

Figure 1:
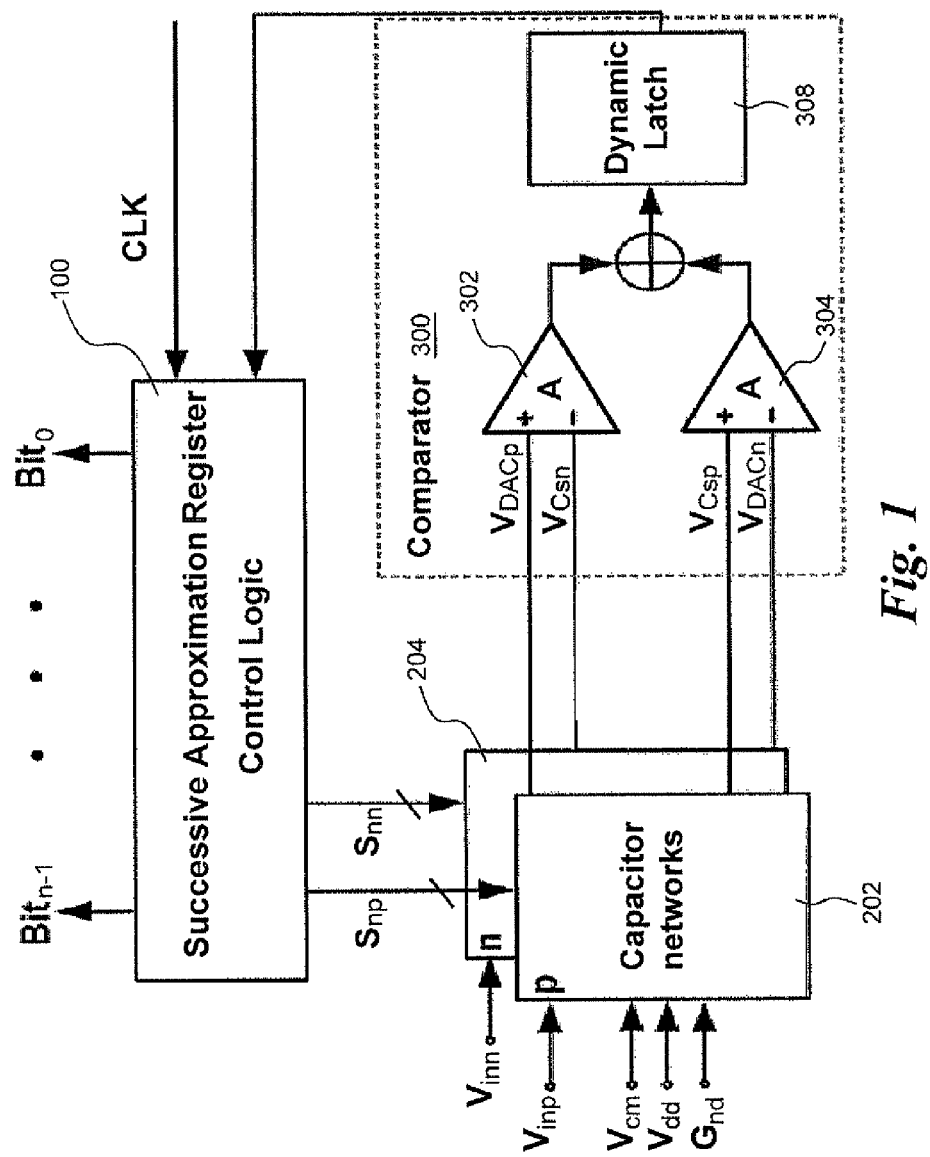
FIG. 1 shows a block diagram of the n-bits SAR ADC circuit according to the present invention.

First, please refer to FIG. 1. FIG. 1 is a block diagram of the n-bits SAR ADC circuit according to the present invention. As shown in FIG. 1, the n-bits SAR ADC circuit according to the present invention comprises: a SAR control logic (100), a p-type capacitor network (202), an n-type capacitor network (204), and a comparator (300). The p-type capacitor network (202) includes a $DAC_p$ array (unshown) and a sampling capacitor $C_{Sp}$ (unshown). On the other hand, the n-type capacitor network (204) includes a $DAC_n$ array and a sampling capacitor $C_{Sn}$. The comparator (300) is composed of a first pre-amplifier (302), a second pre-amplifier (304) and a dynamic latch (308). Alternatively, the comparator is composed of a four-input pre-amplifier and a dynamic latch. The SAR control logic (100) provides two series of control signals $S_{np}$ and $S_{nn}$ to the p-type capacitor network (202) and the n-type capacitor network (204), respectively.

Conventionally, a p-type capacitor network has four inputs including: $V_{inp}$, $V_{cm}$, $V_{ref,p}$ and $V_{ref,n}$, and a n-type capacitor network has four inputs including: $V_{inn}$, $V_{cm}$, $V_{ref,p}$ and $V_{ref,n}$. Where $V_{inp}$ is the voltage of input analog signal of the p-type capacitor network; $V_{inn}$ is the voltage of input analog signal of the n-type capacitor network; $V_{ref,p}$ and $V_{ref,n}$ are two reference voltages produced by a reference voltage generator; and $V_{cm}$ is the voltage of common mode, which is produced by $V_{ref,p}$ and $V_{ref,n}$ and the value of $V_{cm}$ is a fraction of $V_{ref,p}$ and $V_{ref,n}$ ($V_{cm}$ is the middle level of $V_{ref,p}$ and $V_{ref,n}$). The outputs of p-type capacitor network and n-type capacitor network, including $V_{DACp}$ and $V_{DACn}$, are inputted to a comparator. Subsequently, the output of the comparator is inputted to a SAR control logic. It should be noted that conventional p-type capacitor network and n-type capacitor network do not have the sampling capacitor $C_{Sp}$ and $C_{Sn}$, where only two outputs $V_{DACp}$ and $V_{DACn}$ are provided to the comparator.

On the contrary, according to the present invention, as shown in FIG. 1, the p-type capacitor network has four inputs including: $V_{inp}$, $V_{cm}$, $V_{dd}$ and $G_{nd}$, and the n-type capacitor network has four inputs including: $V_{inn}$, $V_{cm}$, $V_{dd}$ and $G_{nd}$. Where $V_{inp}$ is the voltage of input analog signal of the p-type capacitor network; $V_{inn}$ is the voltage of input analog signal of the n-type capacitor network; $V_{dd}$ is the voltage of power supply; $G_{nd}$ is grounded; and $V_{cm}$ is the voltage of common mode, which is produced by $V_{dd}$ and $G_{nd}$ and the value of $V_{cm}$ is a fraction of $V_{dd}$ and $G_{nd}$ ($V_{cm}$ is the middle level of $V_{dd}$ and $G_{nd}$). It should be noted that, in the present invention, the capacitor networks use the inputs $V_{dd}$ and $G_{nd}$ to replace conventional inputs $V_{ref,p}$ and $V_{ref,n}$ which are produced by a reference voltage generator. In addition, according to the present invention, the sampling capacitors $C_{Sp}$ and $C_{Sn}$ (not shown in FIG. 1) are provided in the p-type capacitor network and the n-type capacitor network, respectively. The effect of the sampling capacitors is to provide an opposite input signal to the DAC, which will be described later. In the present invention, the outputs of p-type capacitor network and n-type capacitor network, including $V_{DACp}$, $V_{Csn}$, $V_{Csp}$ and $V_{DACn}$, are inputted to a comparator. Subsequently, the output of the comparator is inputted to a SAR control logic. It should be noted that, in the present invention, the p-type capacitor network and the n-type capacitor network totally have four outputs including $V_{DACp}$, $V_{Csn}$, $V_{Csp}$ and $V_{DACn}$ rather than conventional two outputs.

As described above, according to the present invention, the p-type capacitor network includes a $DAC_p$ array and a sampling capacitor $C_{Sp}$. Similarly, the n-type capacitor network according to the present invention includes a $DAC_n$ array and a sampling capacitor $C_{Sn}$. As shown in FIG. 1, $V_{DACp}$ denotes the voltage of output of DAC array in the p-type capacitor network; $V_{DACn}$ denotes the voltage of output of DAC array in the n-type capacitor network; $V_{Csp}$ denotes the voltage of output of the sampling capacitor $C_{Sp}$ in the p-type capacitor network; and $V_{Csn}$ denotes the voltage of output of the sampling capacitor $C_{Sn}$ in the n-type capacitor network. As shown in FIG. 1, $V_{DACp}$ and $V_{Csn}$ are inputted to the pre-amplifier (302). On the other hand, $V_{DACn}$ and $V_{Csp}$ are inputted to the pre-amplifier (304). The outputs of the pre-amplifier (302) and the pre-amplifier (304) are summed together and then inputted to the dynamic latch (308). The output of the dynamic latch (308) is a signal (0, 1) to be feedbacked to the SAR control logic (100).

Figure 2:
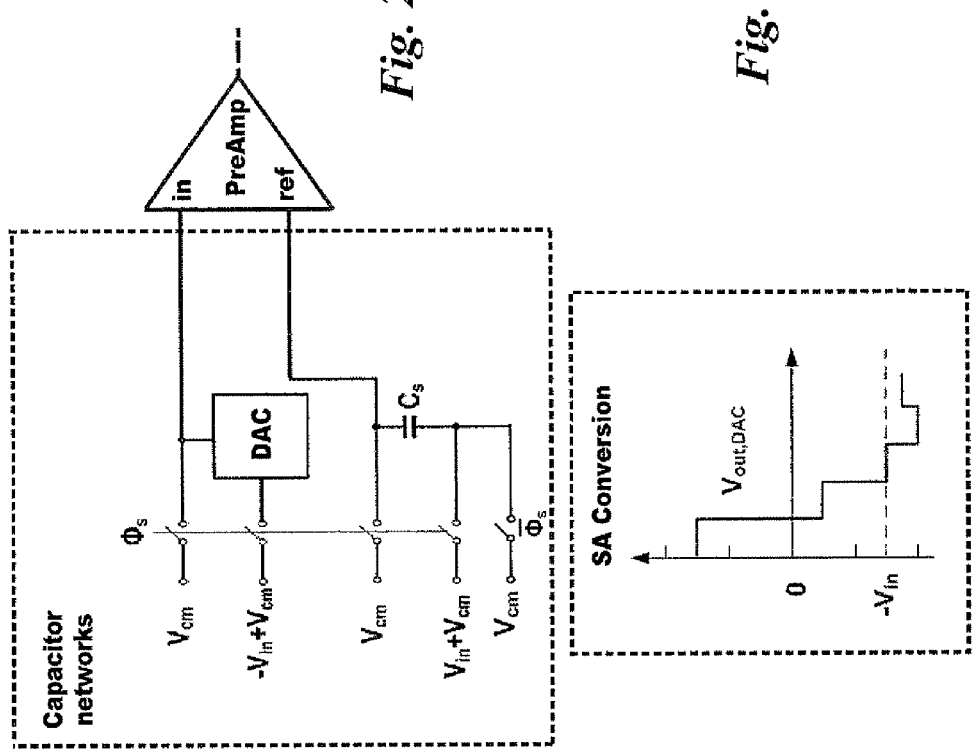

Next, please refer to FIG. 2a. FIG. 2a shows a conceptual sampling scheme and the connecting relationship between the capacitor network and the pre-amplifier shown in FIG. 1. As shown in FIG. 2a, five signals are inputted, wherein a first set of two signals $V_{cm}$ and $-V_{in}+V_{cm}$ are inputted to the top-plate and bottom-plate of the DAC array, respectively. In a second set of three signals, two signals $V_{cm}$ and $V_{in}+V_{cm}$ are inputted to bottom-plate of the sampling capacitor $C_S$, and another signal $V_{cm}$ is put to the top-plate of the $C_S$. The outputs of the DAC array and $C_S$ are connected to the in-terminal and ref-terminal of the pre-amplifier, respectively. During the sampling phase, ($\Phi_S$ is on), two opposite input signals $-V_{in}+V_{cm}$ and $V_{in}+V_{cm}$ are sampled onto the bottom-plate of the DAC array and $C_S$, respectively. During the SA conversion phase ($\overline{\Phi}_S$ is on), the output of the $C_S$ will appear a $-V_{in}$ to the ref-terminal of the pre-amplifier, while in the conventional scheme the ref-terminal of the pre-amplifier is zero.

The sampling capacitor $C_S$ of the present invention servers to hold the input signal for the SA conversion, consequently no specific matching condition is required between $C_S$ and the DAC array. However, $C_S$ must be large enough to comply with the kT/C noise constraint.

FIG. 2b shows the present invention output of the DAC array $V_{out,DAC}$ during SA conversion. As shown in FIG. 2b, due to using the sampling capacitor $C_S$, which holds the $-V_{in}$ at the ref-terminal of the pre-amplifier, the output of the DAC array is approximating to $-V_{in}$ instead of conventional zero. The conventional and present invented conversion schemes can be represented as following formulas.

The conventional SA algorithm drives the output of DAC array to zero at the end of the bit-cycling, according to the following formula (1):

$$V_{in} - \frac{\sum_n S_n C_n V_{ref,con}}{C_{DAC,Sum}} \to 0; \quad (1)$$

On the contrary, the SA algorithm according to the present invention drives the output of DAC array to $-V_{in}$ instead of zero at the end of the bit-cycling, according to the following formulas (2) and (3):

$$V_{in} - \frac{\sum_n S_n C_n V_{ref,pro}}{C_{DAC,Sum}} \to V_{in} \quad (2)$$

$$2V_{in} - \frac{\sum_n S_n C_n V_{ref,pro}}{C_{DAC,Sum}} \to 0 \Rightarrow V_{ref,pro} = 2V_{ref,con}. \quad (3)$$

In the above formulas, $S_n$ (1 or 0) is the ADC decision for bit n; $C_n$ and $C_{DAC,Sum}$ represent the capacitors connected the reference voltage and the total array capacitance, respectively; $V_{ref,pro}$ is the reference voltage proposed in the present invention; and $V_{ref,con}$ is the reference voltage used in a conventional SAR algorithm. As obviously seen from the above Formula (3), the value of $V_{ref,pro}$ is two times of the value of $V_{ref,con}$. Therefore, the power supply can be directly used as the reference voltage.

Figure 3:
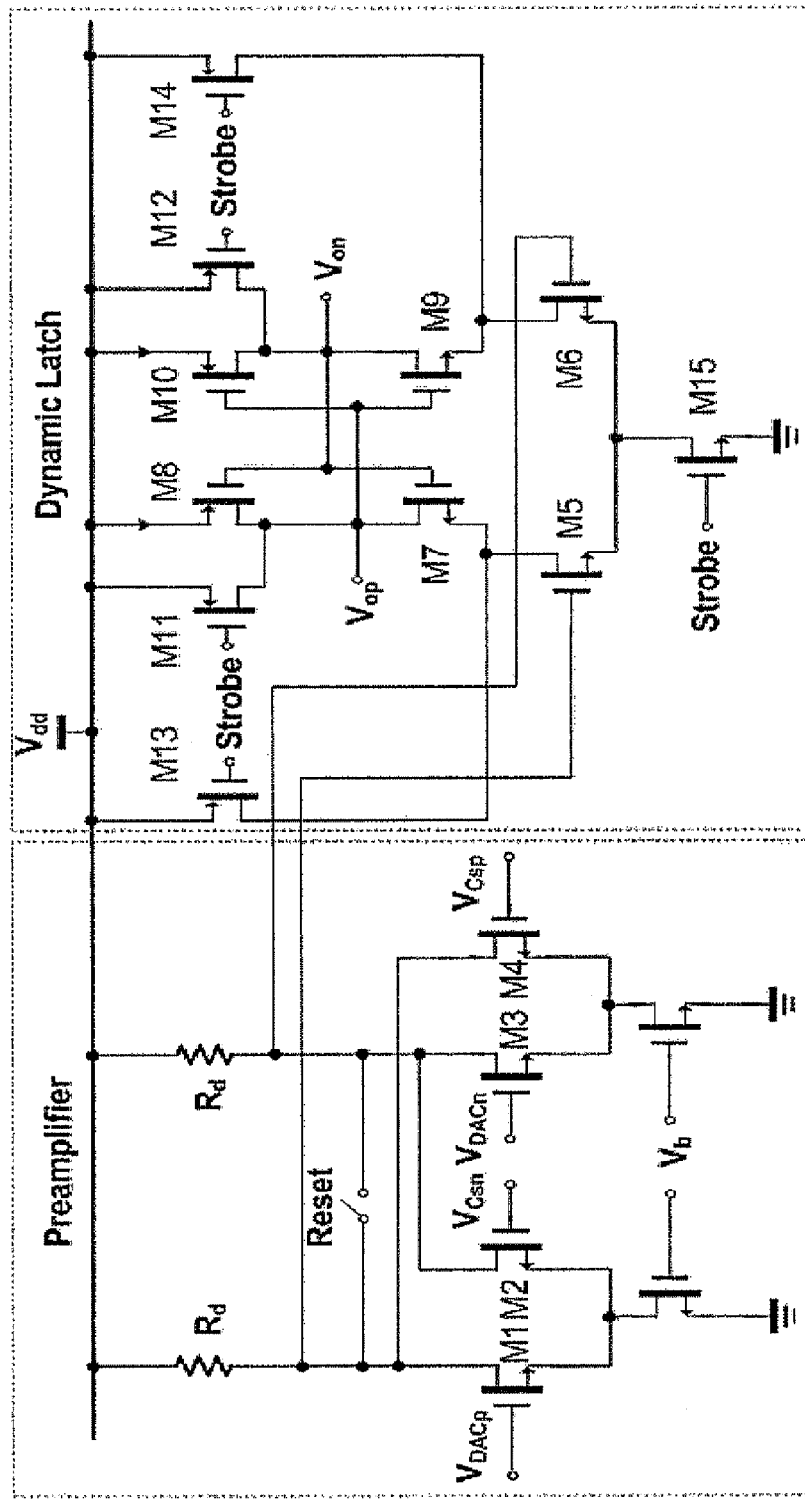
FIG. 3 shows a block diagram of the comparator shown in FIG. 1.

Next, please refer to FIG. 3. FIG. 3 shows a block diagram of the comparator according to the present invention. The comparator pre-amplifier has two differential pairs M1, M2 and M3, M4 connected to the outputs of the differential capacitive DAC and the additional sampling capacitor $C_S$. The input differences of M1 to M4 change the currents following through resistive loads Rd, which are summed up and appear as the voltage difference to the dynamic latch. The bias current and the load resistance yield a pre-amplifier gain of tens dB. The comparison cycling is divided into a reset phase and a generation phase. During the reset phase (STROBE=0), the pre-amplifier output is shorted to avoid memory effect of the comparison. Moreover, M11-M14 reset the regenerative loop and set the outputs $V_{op}$ and $V_{on}$ to $V_{dd}$. Since the current source transistor M15 is switched off, no current flows from the supply to ground. When the regeneration phase starts (STROBE=1), M15 switches on and the input transistor M5-M6 force currents flowing through back-to-back inverters M7-M8 and M9-M10 to amplify the voltage difference to a full swing.

Figure 4:
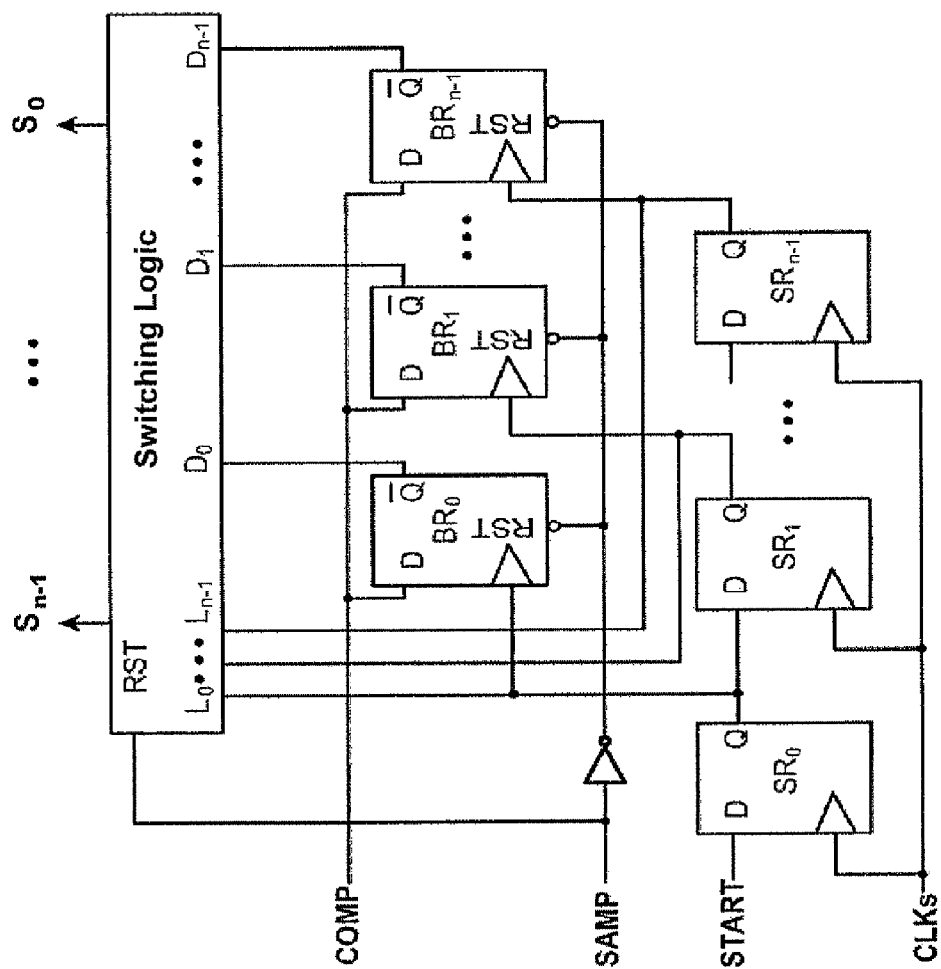
FIG. 4 shows a block diagram of the SAR control logic shown in FIG. 1.

Next, please refer to FIG. 4. FIG. 4 shows a block diagram of the SAR control logic according to the present invention. As shown in FIG. 4, the SAR control logic according to the present invention comprises a set of shift registers ($SR_0$-$SR_{n-1}$), a set of bit registers ($BR_0$-$BR_{n-1}$) and a switching logic. The $CLK_s$ used to control the shift registers are synchronous with the reset of the comparator. The bit register detects each bit decision from the comparator and locks it for next stage processing.

In summary, the present invention provides a sampling capacitor in the p-type capacitor network and the n-type capacitor network, respectively. In addition, the p-type capacitor network and the n-type capacitor network in the present invention use $V_{dd}$ and $G_{nd}$ to replace conventional reference voltages produced by a reference voltage generator. Accordingly, the present invention can significantly improve the power efficiency of a SAR ADC circuit.

The above description is made with respect to one embodiment of the present invention. However, the present invention is not limited to the above description. People of ordinary skill in the same field may make various modifications to the details of the embodiment without departing from the scope and the spirit of the present invention.

What is claimed is:

1. An n-bits successive approximation register (SAR) analog-to-digital converting (ADC) circuit, comprising:
   an n-bits SAR control logic;
   a p-type capacitor network including a $DAC_p$ array and a sampling capacitor $C_{Sp}$;
   an n-type capacitor network including a $DAC_n$ array and a sampling capacitor $C_{Sn}$; and
   a comparator for comparing outputs from the p-type capacitor network and the n-type capacitor network,
   wherein a power supply and ground are directly connected to the p-type capacitor network and the n-type capacitor network without using reference voltages produced by a reference voltage generator.

2. The SAR ADC circuit according to claim 1, wherein the n-bits SAR control logic comprises n shift registers, n bit registers, and a switching logic.

3. The SAR ADC circuit according to claim 1, wherein the comparator comprises a first pre-amplifier, a second pre-amplifier and a dynamic latch.

4. The SAR ADC circuit according to claim 1, wherein the comparator comprises a four-input pre-amplifier and a dynamic latch.

5. The SAR ADC circuit according to any one of claims 1-4, wherein in the p-type capacitor network and n-type capacitor network, the signal inputted to the DAC array is opposite to the signal inputted to the sampling capacitor.

6. The SAR ADC circuit according to any one of claims 1-4, wherein sampling capacitor is selected to provide a voltage $-V_{in}$.

* * * * *